US007462776B1

(12) United States Patent
Carpenter, Jr. et al.

(10) Patent No.: US 7,462,776 B1
(45) Date of Patent: Dec. 9, 2008

(54) LOW IMPEDANCE GROUNDING ELECTRODE WITH UNIVERSAL CONNECTIONS AND RAPID ACCESS CAP

(75) Inventors: Roy B. Carpenter, Jr., deceased, late of Boulder CO (US); by Peter Carpenter, legal representative, Boulder, CO (US); Nathan M. Mascarenas, Windsor, CO (US); Darwin N. Sletten, Westminster, CO (US)

(73) Assignee: Lightning Eliminators & Consultants, Inc., Boulder, CO (US)

( * ) Notice: Subject to any disclaimer, the term of this patent is extended or adjusted under 35 U.S.C. 154(b) by 0 days.

(21) Appl. No.: 11/757,201

(22) Filed: Jun. 1, 2007

(51) Int. Cl.
*H05K 5/02* (2006.01)

(52) U.S. Cl. ..................... 174/51; 174/5; 174/6; 174/7; 174/40 CC; 439/92; 361/753

(58) Field of Classification Search ..................... 174/5, 174/6, 7, 7.5, 51, 40 CC; 439/92, 426, 98; 361/753, 799
See application file for complete search history.

(56) References Cited

U.S. PATENT DOCUMENTS

| | | | | |
|---|---|---|---|---|
| 3,494,849 | A * | 2/1970 | Hess | 204/196.16 |
| 4,861,940 | A | 8/1989 | Carpenter, Jr. | |
| 5,801,327 | A * | 9/1998 | Tobias | 174/6 |
| 5,998,731 | A * | 12/1999 | Takamura | 174/3 |
| 6,137,049 | A * | 10/2000 | Hecock | 174/7 |
| 6,515,220 | B1 | 2/2003 | Carpenter, Jr. | |
| 7,138,579 | B2 * | 11/2006 | Megason et al. | 174/51 |
| 7,282,637 | B2 * | 10/2007 | Stockin et al. | 174/6 |

* cited by examiner

*Primary Examiner*—Dhiru R Patel
(74) *Attorney, Agent, or Firm*—Faegre & Benson LLP

(57) ABSTRACT

An all stainless steel grounding electrode uses a coating of stainless steel for an upper collar which has a dual purpose cable connector. The cable connector can accommodate a cable lug and bolt connection or a cad weld connection. A cap for the collar has a one quarter turn dual heavy duty thread set to prevent corrosion from locking up the cap. An osmotic material is placed and replaced in the grounding electrode via the cap.

14 Claims, 7 Drawing Sheets

3 / 7

LOW IMPEDANCE GROUNDING ELECTRODE WITH UNIVERSAL CONNECTIONS AND RAPID ACCESS CAP

FIELD OF INVENTION

The present invention relates to chemically activated grounding electrodes that provide a low resistance connection to earth.

BACKGROUND OF THE INVENTION

U.S. Pat. No. 6,515,220 B1 (2003) to Carpenter, Jr. discloses a chemically activated grounding electrode constructed from a copper cylinder, a copper upper collar and a copper screw on cap. The copper cylinder has a lug onto which a grounding cable may be exothermically welded. During manufacturing the upper collar is exothermically welded to the cylinder, and the lug is welded to the cylinder.

An osmotic conductor is poured into the cylinder, and then the electrode is buried in the earth with the cap accessible at or above the earth's surface. The threads for the cap are traditional 360° threads. In the field the traditional 360° threads become galvanically corroded. When this happens, the osmotic conductor inside the cylinder cannot be checked or replaced. Copper was found to deteriorate over time, and some applications required zinc or tin coatings on the copper cylinder. When this is done, corrosion from dissimilar metals occurs at joints. The end user could not bolt on a grounding cable of his own choice since the exothermic welded grounding cable was shipped with the grounding electrode.

What is needed is a corrosion resistant construction for the cylinder, a single mold construction for the collar and the attachment lug, a one metal construction to avoid corrosion at joints, a non-corroding cap attachment means, and a multi-purpose lug connector for the grounding wire.

The present invention is made of all stainless steel construction. A multi-purpose connector provides for either an exothermic weld connection and/or a wire through stud connection using a bolt to the grounding wire. The cap has a pair of thick ramp type threads which lock with a 90° turn of the cap. Thus, a longer life grounding electrode is provided that can perform in all soil conditions without a costly coating procedure for the cylinder.

SUMMARY OF THE INVENTION

An aspect of the present invention is to provide a corrosion resistant cap for a ground electrode, said cap having a 90° corrosion resistant thread.

Another aspect of the present invention is to provide a multi-purpose connector for a grounding wire affixed to the grounding electrode.

Another aspect of the present invention is to provide an all stainless steel construction.

Another aspect of the present invention is to provide a single mold construction for the collar and the attachment lug.

Other aspects of this invention will appear from the following description and appended claims, reference being made to the accompanying drawings forming a part of this specification wherein like reference characters designate corresponding parts in the several views.

The present invention uses a stainless steel tube with a bottom. On the upper part of the tube is placed a collar cast from stainless steel. The collar has two female thread segments that run one quarter turn on the outside of the collar. The cap has two male one quarter turn twin threads that mate with the collar's threads. A large bolt head is located on the top of the cap to enable a large wrench to open the cap.

The collar has a multi-purpose lug that includes a stud for an exothermic weld connection and a plate with a bolt hole for a wire to lug connection.

Before explaining the disclosed embodiment of the present invention in detail, it is to be understood that the invention is not limited in its application to the details of the particular arrangement shown, since the invention is capable of other embodiments. Also, the terminology used herein is for the purpose of description and not of limitation.

DETAILED DESCRIPTION OF THE DRAWINGS

Figure 1:
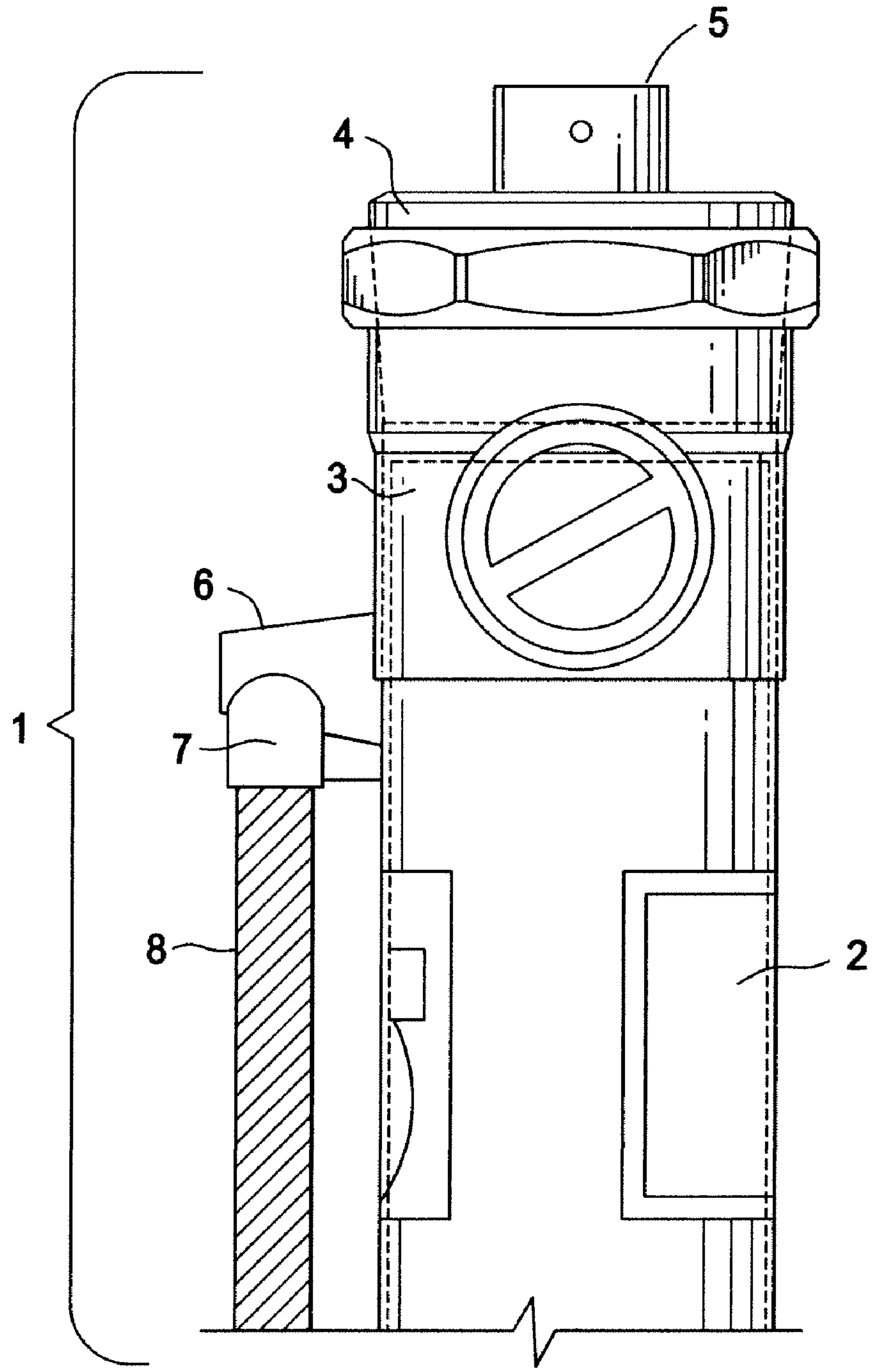
FIG.1 (PRIOR ART)
FIG. 1 (prior art) is a front plan view of a copper grounding electrode with an exothermic weld connection to a grounding wire.

Referring first to FIG. 1 a prior art grounding electrode 1 is made of a copper tube 2 with a bottom not shown. A copper collar 3 is welded onto the tube 2. The cap 4 is copper. The cap 4 has 360° male threads that mate with the 360° female threads of the collar, not shown. A bolt head 5 allows a large wrench to remove the cap 4 if the threads are not corroded.

A lug 6 projects from the tube 2. It is a part of an exothermic weld for the end cap 7 of the grounding cable 8. The lug 6 is welded to the tube 2 during manufacturing. The grounding cable 8 is generally welded to the lug 6 in the factory or in the field.

Figure 2:
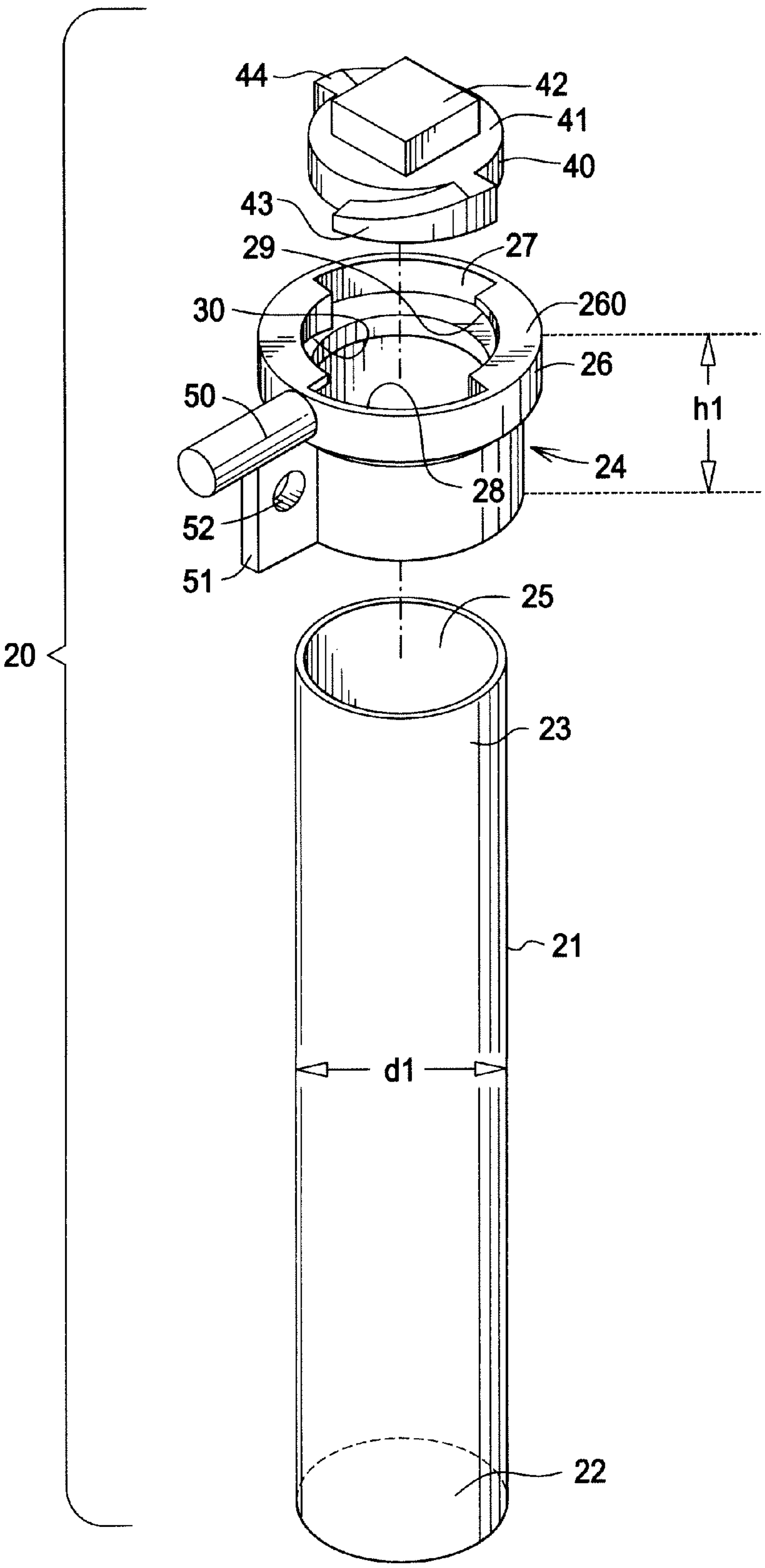
FIG. 2 is an exploded view of the preferred embodiment.

In FIG. 2 the grounding electrode 20 has a stainless steel tube 21 with a bottom 22 and an upper segment 23. Osmotic material can be placed into hollow 25. A collar 24 is made as a single stainless steel mold along with the lug 50. The collar 24 is made as a stainless steel casting. It is welded to tube 21. The collar 24 has an upper flange 26 which has an upper shelf 260. The upper shelf 260 has a first recess 27 and a second recess 28. Recess 27 transitions into a quarter turn female thread 29. Recess 28 transitions into a quarter turn female thread 30.

The cap 40 is stainless steel. It has a top shelf 41 which has a square bolt head 42 for a wrench. Male thread 43 is about ½" thick at the start of its taper, and 3/16" thick at the end of its taper. It fits into recess 28, and thread 44 fits into recess 27. A quarter turn (90°) clockwise will lock the cap 40 to the collar 24.

Figure 3:
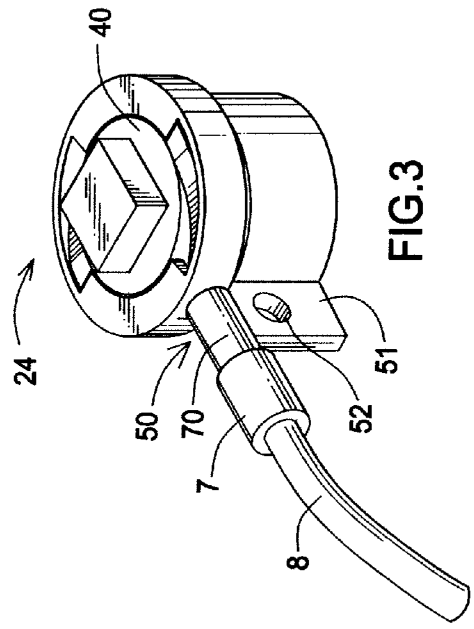
FIG. 3 is a top perspective view of a grounding cable welded to the attachment lug.

The collar 24 has a lug 50 for an exothermic weld connection to a grounding cable 8 using end cap 7 as seen in FIG. 3. The user can also bolt a cable lug to plate 51 via hole 52. Nominal dimensions are $h_1$=2½", $d_1$=2½".

Referring next to FIG. 3 the lug 50 has a rod 70 for welding the end cap 7 thereto.

Figure 4:
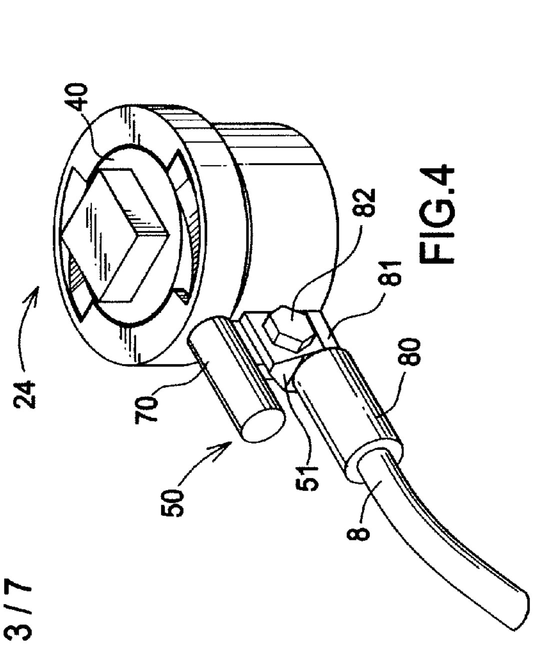
FIG. 4 is a top perspective view of a grounding cable bolted to the attachment lug.

In FIG. 4 the cable 8 has an end cap 80 crimped to it. The end cap 80 has a bracket 81 with a hole to align with hole 52 of plate 51. The bolt 82 (and nut not shown) join the bracket 81 to the plate 51.

Figure 6:
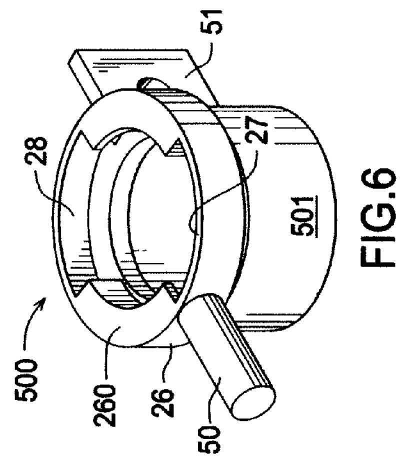
FIG. 6 is a top perspective view of the collar shown in FIG. 5.
Figure 5:
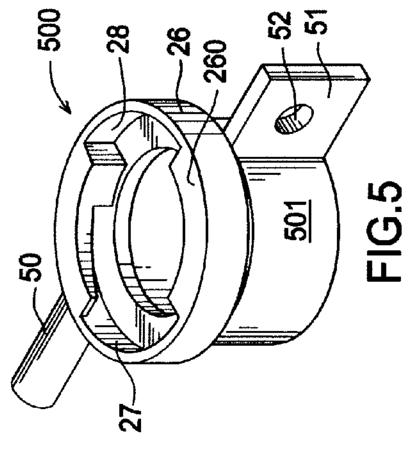
FIG. 5 is a top perspective view of an alternate embodiment collar.

Referring next to FIGS. 5, 6 a collar 500 is made from a single stainless steel casting. The upper flange 26 and upper shelf 260 are the same as collar 24 of FIG. 2. Recesses 27, 28 receive the same cap 40 as shown in FIG. 2. The lug 50 protrudes from upper flange 26. The plate 51 protrudes from the body 501 of the collar about 180 degrees to the opposite side of the cap as the lug 50. This arrangement facilitates placing a bolt connection in hole 52.

Figure 7:
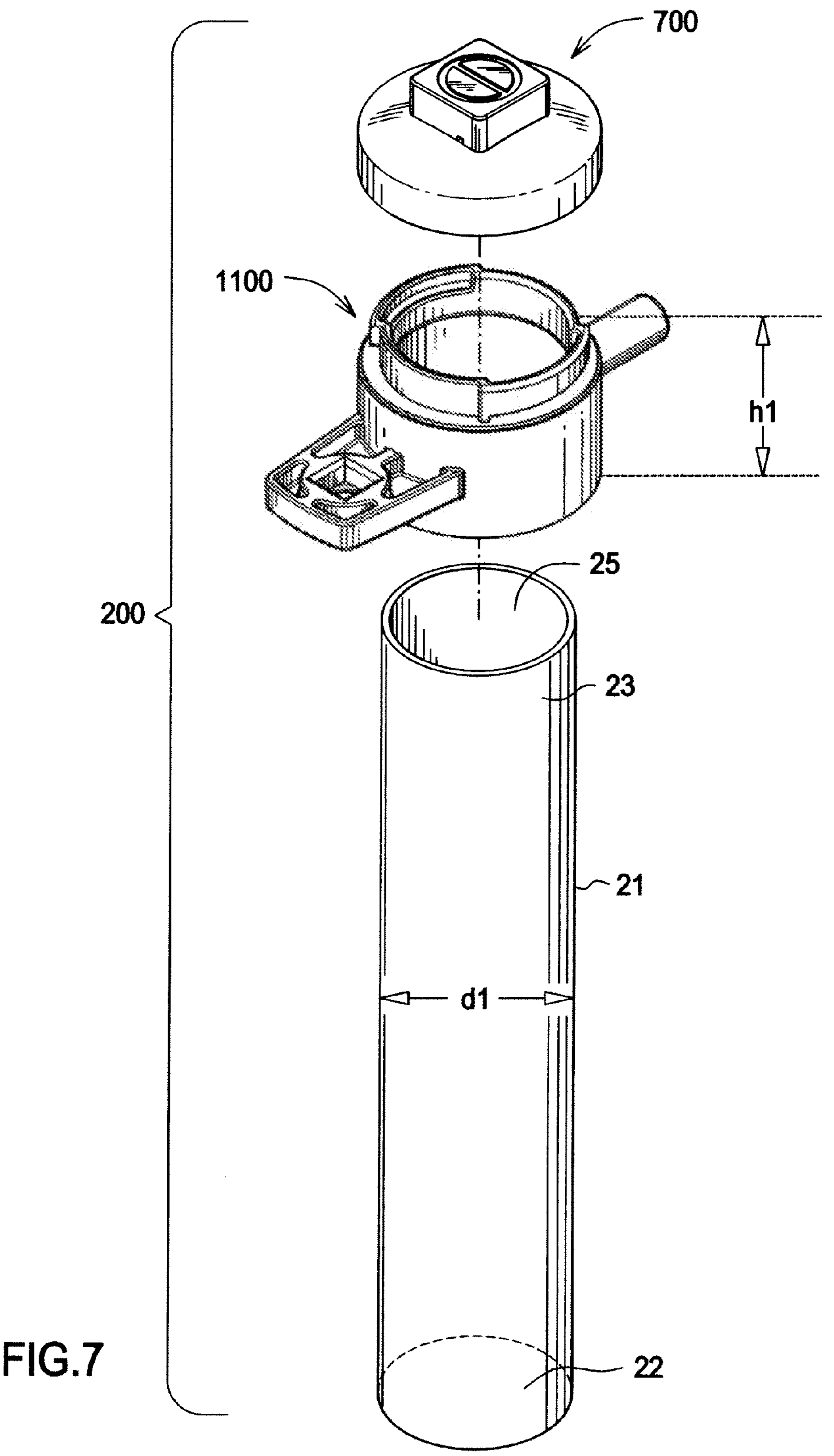
FIG. 7 is an exploded view of an alternate embodiment grounding electrode labeled 200.

Referring next to FIG. 7 an exploded view of grounding electrode 200 is shown. The stainless steel tube 21 is the same as embodiment 20. The collar 1100 and the top 700 are new. A primary difference is the male part of the thread 1101, 1102 is integral with the collar 1100. The female recesses of the thread 717, 718 are housed in the top 700. The collar 1100 has a lug 1120 for a cad weld connection to a grounding cable 8 using end cap 7 shown in FIG. 3. The user can also bolt a cable lug to horizontal flange 1121 via hole 1122.

Figure 8:
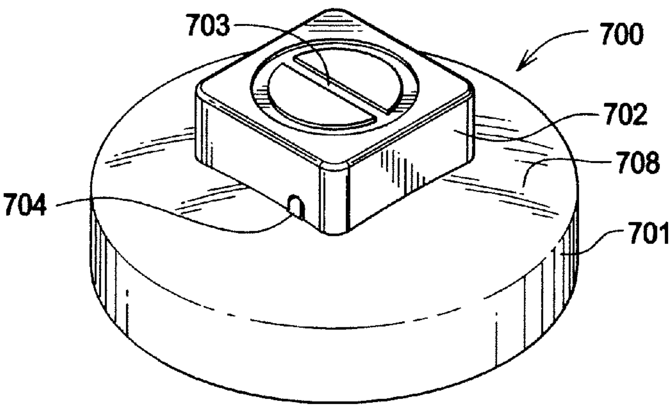
FIG. 8 is a top perspective view of the top shown in FIG. 7.

FIG. 8 shows the top 700 to have a smooth top surface 708 with a central top shelf 702 having a square bolt head for a wrench. A screwdriver slot 703 could be provided. A small vent hole 704 is also provided. The sides 701 are smooth.

Figure 9:
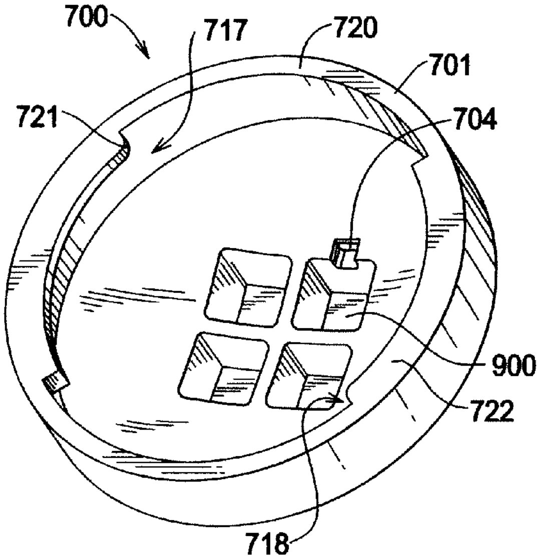
FIG. 9 is a bottom perspective view of the top for grounding electrode 200.
Figure 10:
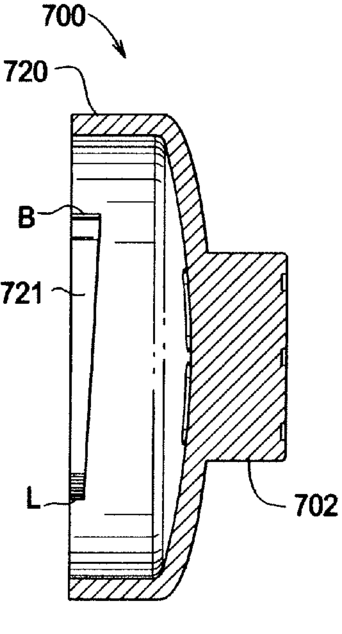
FIG. 10 is a cross sectional view of the top shown in FIG. 8.

In FIG. 9 recesses 900 extend into the stainless steel top shelf 702 as part of a preferred lost wax method of mold making and manufacture. A lower ridge 720 is circular, but thread members 721, 722 extend inward from the outer periphery of the ridge 720. These thread members 721, 722 are tapered to form tapered recesses 717, 718 respectively. FIG. 10 shows thread member 721 having a first end B tapering to second end L.

Figure 11:
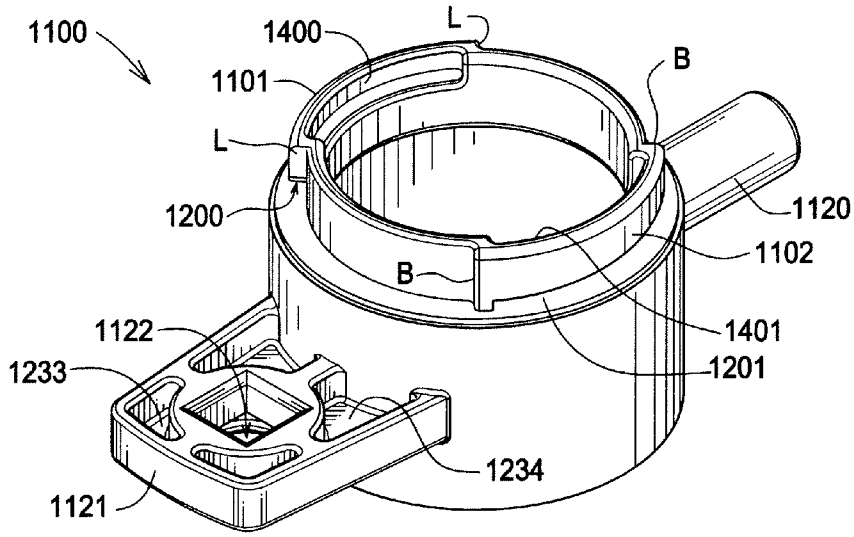
FIG. 11 is a top perspective view of the collar shown in FIG. 7.

Referring next to FIG. 11 a stainless steel collar 1100 has a flange 1121 oriented 180° from a lug 1120. The male thread members 1101, 1102 taper from a big width B to a smaller width L. Thus, the recesses 1200, 1201 are tapered to lock with thread members 721, 722 with a 90° twist of the top 700. Recesses 1233, 1234 facilitate the one piece molding operating used to form collar 1100.

Figure 12:
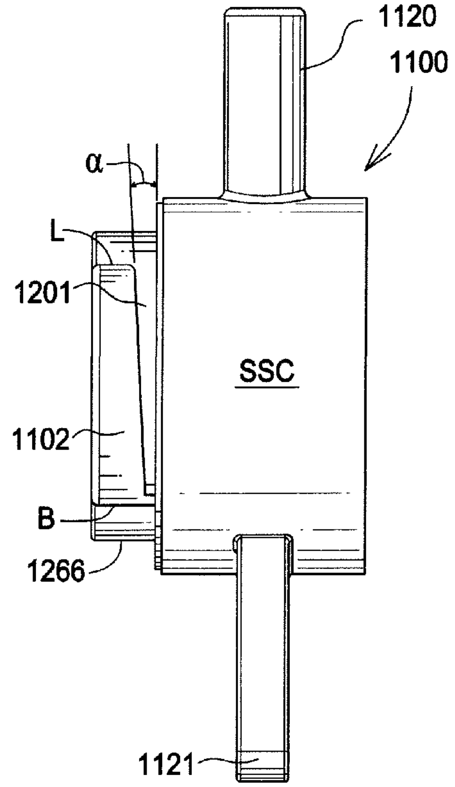
FIG. 12 is side plan view of the collar shown in FIG. 11.
Figure 14:
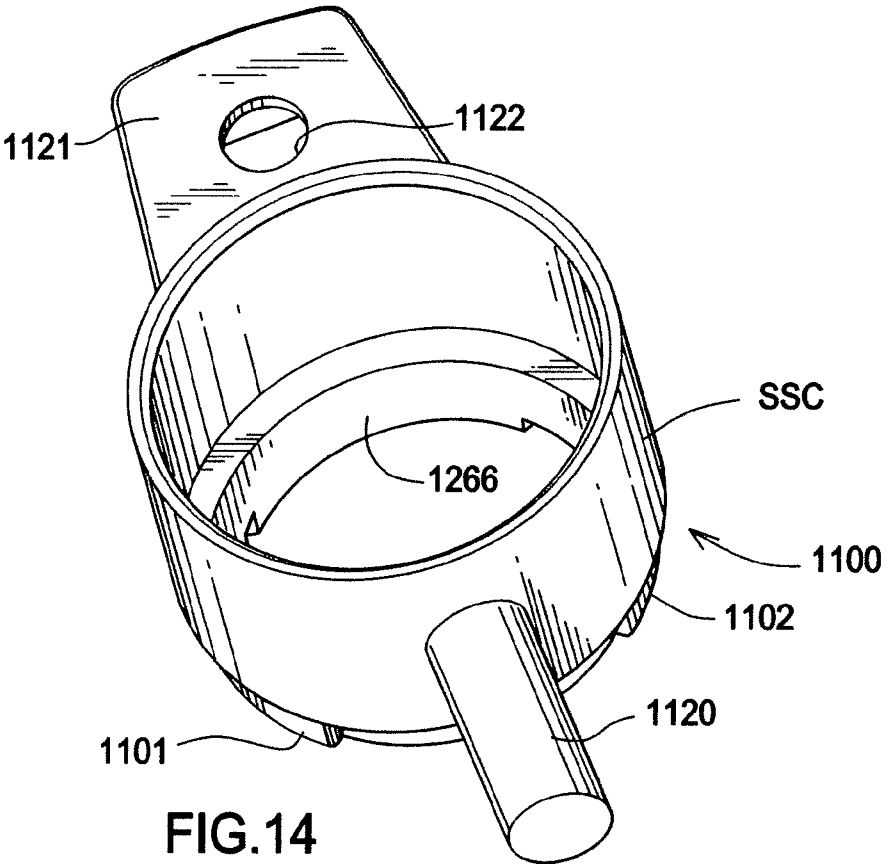
FIG. 14 is a bottom perspective view of the collar shown in FIG. 11.

FIG. 12 shows the stainless steel cylindrical body SSC of the collar 1100, with a preferred angle ANG of 3°. An upper ring 1266 supports the male thread members 1101, 1102.

Figure 13:
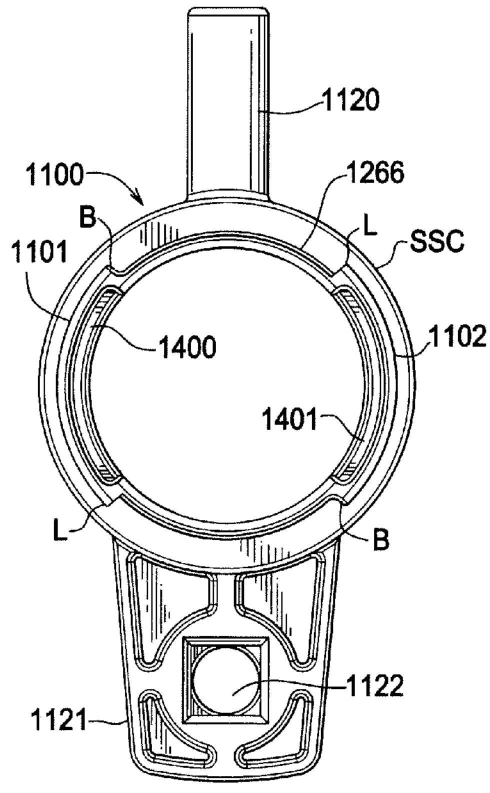
FIG. 13 is a top plan view of the collar shown in FIG. 11.

FIG. 13 illustrates the slots 1400, 1401 formed between body SSC and ring 1266 which is covered by the top 700.

Figure 15:
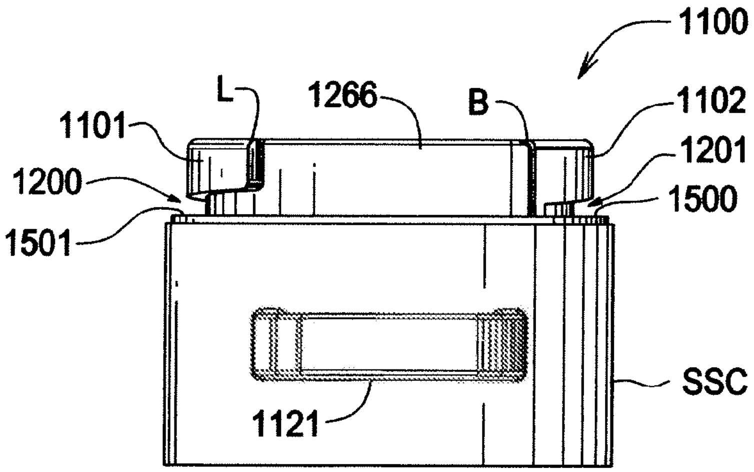
FIG. 15 is a side plan view of the collar shown in FIG. 11.

In FIG. 15 best illustrates the recesses 1200, 1201. The thread members 721, 722 rest on ledges 1500, 1501 on top of the body SSC and lock into recesses 1200, 1201.

Although the present invention has been described with reference to preferred embodiments, numerous modifications and variations can be made and still the result will come within the scope of the invention. No limitation with respect to the specific embodiments disclosed herein is intended or should be inferred. Each apparatus embodiment described herein has numerous equivalents.

We claim:

1. A grounding electrode comprising:

a cylindrical stainless steel tube having a bottom and having a top segment;

a stainless steel collar attached to the top segment of the stainless steel tube;

said stainless steel collar having an attachment lug with a rod to provide a weld connection to a cable end, and having a plate with a mounting hole to receive a bolt for a cable end with a bracket connector;

said stainless steel collar having a stainless steel top with at least two recesses to receive in each recess a male thread segment of a stainless steel cap; and wherein a one quarter turn of the cap locks each male thread segment into a respective female thread segment of the stainless steel collar.

2. The grounding electrode of claim 1, wherein the cap further comprises a square bolt head lug for accepting a wrench.

3. The grounding electrode of claim 1, wherein the cylindrical stainless steel tube is filled with an osmotic material.

4. The grounding electrode of claim 1, wherein the lug rod is connected to the plate.

5. The grounding electrode of claim 4, wherein the plate is aligned in a vertical plane below the rod.

6. The grounding electrode of claim 1, wherein the collar and the lug are made in a one piece mold.

7. The grounding electrode of claim 6, wherein the collar is attached to the top segment of the stainless steel tube by means of a weld.

8. The grounding electrode of claim 1, wherein the plate is located on an opposite side of the collar from the lug rod.

9. An all stainless steel grounding electrode comprising:

a cylindrical tube having a bottom to contain and osmotic material;

a collar welded to a top segment of the tube;

said collar having a dual purpose lug for connection to a grounding cable;

wherein a rod projects from the collar for a purpose of welding a cable end thereto;

wherein a plate having a mounting hole projects from the collar for a purpose of bolting a bracket end of a cable thereto;

said collar having at least two recesses integrated into at least two female threads;

a cap having at least two male threads designed to lock into a respective female thread of the collar; and wherein the male threads lock into the female threads with a one quarter turn of the cap.

10. The grounding electrode of claim 9, wherein the plate is connected to the rod and extends from the collar below the rod.

11. The grounding electrode of claim 9, wherein the plate is located on an opposite side of the collar from the rod.

12. A grounding electrode comprising:

a hollow cylindrical container with a closed bottom and an open top;

a collar connected to the top;

said collar having a mounting flange with a hole and having a mounting lug oriented about 180° from the mounting flange;

said collar having a top ledge supporting a support ring;

said support ring having a first male thread member projecting outbound from the support ring and having a taper, wherein a first tapered recess is formed between the top ledge and the first male thread member;

said support ring having a second male thread member oriented about 180° from the first male thread member;

wherein a second recess is formed having a image of the first recess;

a top having a smooth outside edge with the lower ridge;

said lower ridge having a first thread member projecting inbound designed to be received in the first recess, and a second thread member projecting inbound designed to be received in the second recess;

said top having a bolt head tightening fixture; and wherein a one quarter turn of the top locks the first and second male thread members into their respective first and second recess of the top.

13. The apparatus of claim 12, wherein the container, collar and top are all made of stainless steel.

14. The apparatus of claim 13, wherein the top further comprises a vent hole.

* * * * *